United States Patent
Pattanaik et al.

(10) Patent No.: US 6,543,677 B2
(45) Date of Patent: Apr. 8, 2003

(54) SOLDER-BALL BONDING DEVICE AND METHOD

(75) Inventors: Surya Pattanaik, San Jose, CA (US); Takuya Satoh, Hayama-machi (JP); Tatsumi Tsuchiya, Ayase (JP); Tatsushi Yoshida, Chigasaki (JP)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/872,252

(22) Filed: May 31, 2001

(65) Prior Publication Data

US 2002/0179696 A1 Dec. 5, 2002

(30) Foreign Application Priority Data

Jun. 23, 2000 (JP) ........................................ 2000-189148

(51) Int. Cl.[7] ...................... B23K 35/12; B23K 31/00; B23K 31/02; B23K 26/00
(52) U.S. Cl. ................. 228/246; 228/245; 228/180.22; 228/33; 228/41; 219/121.6; 219/121.63
(58) Field of Search ................................ 228/245, 246, 228/180.22, 33, 41, 56.3, 1.1; 219/121.6, 121.65, 121.66, 121.75, 121.61, 121.63

(56) References Cited

U.S. PATENT DOCUMENTS

| 4,761,699 A | * | 8/1988 | Ainslie et al. ........... 29/603.01 |
| 5,506,385 A | * | 4/1996 | Murakami et al. ...... 219/121.63 |
| 5,653,381 A | * | 8/1997 | Azdasht ..................... 228/254 |
| 5,781,380 A | * | 7/1998 | Berding et al. .......... 360/244.5 |
| 5,828,031 A | * | 10/1998 | Pattanaik ................ 219/121.63 |
| 6,059,176 A | * | 5/2000 | Azdasht et al. ......... 219/121.63 |
| 6,243,508 B1 | * | 6/2001 | Jewell et al. .................. 385/14 |
| 6,321,974 B1 | * | 11/2001 | Tsuchiya et al. ............. 228/1.1 |
| 6,333,483 B1 | * | 12/2001 | Ueno ........................ 219/121.6 |
| 6,336,581 B1 | * | 1/2002 | Tuchiya et al. ............. 228/245 |
| 6,371,356 B1 | * | 4/2002 | Senuma .................... 228/110.1 |
| 6,390,351 B1 | * | 5/2002 | Kasai et al. ................. 228/246 |
| 2002/0113115 A1 | * | 8/2002 | Satoh et al. ................... 228/41 |

FOREIGN PATENT DOCUMENTS

| JP | 8-500295 | 8/1996 |
| WO | WO 95/00279 | 1/1995 |

* cited by examiner

Primary Examiner—Tom Dunn
Assistant Examiner—L. Edmondson
(74) Attorney, Agent, or Firm—Robert B. Martin; Bracewell & Patterson, L.L.P.

(57) ABSTRACT

In devices for solder-ball bonding of a bonding pad of a slider of a head gimbal assembly to a lead pad of a lead, although a device that can perform (1) the supply of solder balls, (2) the positioning of a solder ball, (3) the blowing of nitrogen gas $N_2$, and (4) the melting of the solder ball by laser radiation in one device is available, there are various problems that cannot improve the efficiency of laser radiation, maintenance, or operation efficiency, due to spatial restriction, difficulty of weight reduction, or fixed operation procedures. A solder-ball holder and an optical device are configured separately, and a vacuum pad is provided. A solder ball held in a solder-ball holding hole of the solder-ball holder is transported by the vacuum pad to a connecting portion of a head gimbal assembly, and solder reflow is carried out by the optical device.

6 Claims, 8 Drawing Sheets

SOLDER-BALL BONDING DEVICE AND METHOD

Applicants hereby claim foreign priority benefits to Japanese Patent Application No. 2000-189148, filed Jun. 23, 2000.

BACKGROUND OF THE INVENTION

1. Technical Field

The present invention relates to a device and method for solder-ball bonding a bonding pad formed on a slider on which a head is placed with a lead pad formed at an end of the lead in a head gimbal assembly, which is a constituting part of a hard disk device.

2. Description of the Related Art

Referring now to FIGS. 8 and 9, a head gimbal (HG) assembly 100 is configured of an actuator arm 101 that has an opening 102, and a load beam 104 that extends from the central portion of the flat portion 103 of the actuator arm 101 in the lengthwise direction, to which a part that overlaps the actuator arm 101 is welded. The opening 102 is used when the HG assembly 100 is pivotably held by the HG assembly holder of a magnetic disk device (not shown), and the HG assembly 100 pivots around a virtual axis 150 that passes through the center of the opening 102 substantially vertically to the flat portion 103 in the directions of arrows A and B.

A mounting plate 105 is welded over the nearly central portion of a load beam 104, and flexure 106 is disposed over the center-to-end portion of the load beam 104. The half of the flexure 106 on the side of the mounting plate 105 is welded to the load beam 104, but the end-side half is not welded.

As FIG. 8 shows, an arch-shaped opening 107 is formed on the end portion of the flexure 106, and a slider 109 is fixed by bonding on the flexure tongue 106a (FIG. 9) projecting from the platform 108 in the endmost portion of the flexure 106 toward the center of the arch-shaped opening 107. The flexure tongue 106a is held at a point in the position corresponding to the central portion of the slider 109 by a pivot 104a projecting from the load beam 104 (shown by a broken line in FIG. 9). Thereby the slider 109 can be tilted in relative to the load beam 104 at a predetermined angle (often called pitch, roll, or yaw) in all directions.

Parts of four leads 110 to 113 are laid along the extension 105a that extends from the mounting plate 105, and fixed to the extension 105a via an insulating sheet not to contact to each other. The one end of the extension 105a forms a multi-connector 114.

The four leads 110 to 113 are laid on the mounting plate 105 and the flexure 106 in the pattern shown in FIG. 7, and similarly fixed to them via insulating sheets not to contact to each other. The other end of each lead is floated in the arch-shaped opening 107 as shown in FIG. 8, and each of two leads is bent in a crank shape in pairs and reaches the platform 108.

Here, the paired leads are bent substantially perpendicularly so as to face the front surface 109a of the slider 109 through two openings 114 and 115 formed between the platform 108 and the flexure tongue 106a (FIG. 9), and form lead pads 110a to 113a corresponding to pad-bonding surfaces of four bonding pads 116 to 119 formed on the front surface 109a, respectively. The four leads 110 to 113 are fixed to the platform 108 through an insulating sheet 120 near the end portions. The portion other than the slider 109 of the above-described HG assembly corresponds to the slider holding means.

Next, the method for electrically connecting the four bonding pads 116 to 119 with correspondingly formed lead pads 110a to 113a using a conventional solder-ball bonding device will be described. FIG. 9 shows a schematic diagram of a conventional solder-ball bonding device. The optical system 131 that configures the solder-ball bonding device 130 inputs laser beam generated by a laser oscillator (not shown) through optical fibers 132, passes the laser beam through a condenser lens system for condensing the laser beam to converged beam, and outputs the converged beam to the hollow portion 134a of a capillary 134 through a laser-beam path 133a of the solder-ball feeder 133.

The hollow portion 134a of a capillary 134 mounted to the solder-ball feeder 133 is a path of the converged laser beam, as well as a solder-ball supplying path as described later. The tip of the capillary 134 is cut into a wedge shape, and forms a discharging opening 134b led to the hollow portion 134a. The solder-ball feeder 133 comprises a laser-beam path 133a that connects the optical system 131 and the hollow portion 134a of the mounted capillary 134, a stocker 133b for stocking a plurality of solder balls 135, a solder-ball transporting disc 133c that is rotatably held in the solder-ball feeder 133 by driving means (not shown), an introducing pipe 133d for introducing nitrogen gas $N_2$ from a nitrogen-gas cylinder 8 (not shown) through a tube 136, and a ventilating path 133e for guiding the introduced nitrogen gas $N_2$ to the laser-beam path 133a.

The solder-ball transporting disc 133c has a predetermined number of solder-ball accommodating holes 133f equidistantly formed on the circumference of a predetermined radius from the center of rotation, and a solder-ball accommodating hole 133f accommodates a solder ball 135 that falls when the solder-ball accommodating hole 133f is moved to the position that coincides with the hole (not shown) formed on the bottom of the stocker 133b. When the solder-ball transporting disc 133c rotates and the solder-ball accommodating hole 133f that accommodates a solder ball is moved into the ventilating path 133e, the solder ball 135 falls automatically, and is fed into the capillary 134 by nitrogen gas $N_2$ that is flowing in the arrow direction in the ventilating path 133e.

The solder-ball transporting disc 133c is so configured that another solder-ball accommodating hole 133f formed on the solder-ball transporting disc 133c is then moved to the position that coincides with the hole (not shown) formed on the bottom of the stocker 133b. Thus, each time the solder-ball transporting disc 133c rotates by a predetermined angle in the timing described below, the above-described transportation is repeated, and a solder ball is fed into the capillary 134.

The solder-ball bonding device 130 configured as described above is held by a transporter (not shown) slidably in the F–G direction (vertical direction), which can utilize gravity. On the other hand, on solder-ball bonding, as FIG.

9 shows, the HG assembly 100 is held by a holder (not shown) so that the pad bonding surface 118a of the bonding pad 118 is substantially perpendicular to the bonding surface 112b of the lead pad 112a, and so that each of them is tilted by about 45 degrees to the above described F–G direction.

The partial sectional view of the HG assembly 100 in FIG. 9 corresponds to the sectional view of the cross section in FIG. 8 along the line 151 that passes through the center of the bonding pad 118 viewed from the direction of the arrow C. The HG assembly 100 and the solder-ball bonding device 130 thus held are relatively positioned so that the tip of the capillary 134 equidistantly approaches the bonding pad 118 and the lead pad 112a when the solder-ball bonding device 130 moves a predetermined distance in the G direction as FIG. 9 shows.

When solder-ball bonding is carried out in the above-described configuration, the tip of the capillary 134 is first positioned most close to the pad bonding surface 118a of the bonding pad 118 and the bonding surface 112b of the lead pad 112a, but does not touch these as FIG. 9 shows.

Next, the solder-ball transporting disc 133c is rotated by a predetermined angle to feed a solder ball 135 into the capillary 134 through the $N_2$-gas ventilating path 133e. This solder ball 135 falls in the capillary 134, and is guided by the discharging opening 134b until it stops at the position where it touches the pad bonding surface 118a of the bonding pad 118 and the bonding surface 112b of the lead pad 112a. During this time, nitrogen gas $N_2$ is injected from the introducing pipe 133d into the capillary 134 at the predetermined flow rate to promote falling of the solder ball 135, and the ball 135 is weakly pushed against the above-described surfaces by the gas pressure.

Laser beams are generated in this state. In this time, converged laser beams 137 are partly reflected by the inner wall of the hollow portion 134a of the capillary 134 and radiated to the solder ball 135. The solder ball 135 is melted by this laser radiation, and wets the pad bonding surface 118a of the bonding pad 118 and the bonding surface 112b of the lead pad 112a to form solder-bonded portion. The pad bonding surface 118a of the bonding pad 118 and the bonding surface 112b of the lead pad 112a correspond to the connecting portion where the solder-bonded portion is formed. In this time, nitrogen gas $N_2$ that flows out acts to push the molten solder against each bonding surface, as well as to cover the solder to prevent the oxidation thereof.

Also, when three connecting portions formed by the pairs of other bonding pads and lead pads are solder-bonded, the solder-ball bonding device 130 or the HG assembly 100 is moved in the predetermined directions to change the relative positions so that the desired connecting portion faces the discharging opening 134b of the capillary 134, and the solder-bonded portion is formed by the same bonding operations.

Problems to be Solved by the Invention

As described above, since the conventional solder-ball bonding device is configured so as to perform (1) the supply of solder balls, (2) the positioning of a solder ball, (3) the blowing of nitrogen gas $N_2$, and (4) the melting of the solder ball by laser radiation in one device, there are various problems.

For example, since the optical system has spatial restriction, the laser energy is reduced to ¼ in the stage where the laser beams from the optical system 131 enter the laser-beam path 133a of the solder-ball feeder 133, and further reduced to ⅕ in the stage where the laser beams are reflected in the capillary 134 and reach the discharging opening 134b. That is, the laser energy radiated onto a solder ball is reduced to about 1/20 of the laser energy outputted from the optical fiber 132.

Also, since various functions are integrated, the entire device must be overhauled even when only a part of the device does not work well. In such a case, the reconditioning of the entire device is required after repairing, and the maintenance of the device is cumbersome.

Furthermore, since the weight of the device itself is large, the device is not suited to the positioning method by moving the whole device when relative positioning with the HG assembly is performed. In addition, since all the operations are conducted in one device, the procedures of operations are fixed, and the efficiency cannot be improved by improving the procedures of operations.

Therefore, one object of the present invention is to provide a solder-ball bonding device that has an improved laser radiating efficiency for the reflow of solder balls, that is easy to maintain, and that excels in workability.

SUMMARY OF THE INVENTION

In order to connect a first bonding surface to a second bonding surface, the first bonding surface being on a pad formed on a slider held by slider holding means of a disk device, the second bonding surface being on a pad formed on an end of a lead set on the slider holding means, and the second bonding surface being set substantially perpendicularly to and close to a surface including the first bonding surface, the solder-ball bonding device according to the present invention comprises a solder-ball holder that has a stocker to stock a plurality of solder balls and ball holding holes to hold balls supplied from the stocker in predetermined positions, the solder ball holder being set in a position at a predetermined distance from the slider holding means so that the first bonding surface and the second bonding surface are at acute angles to vertical direction, respectively, and so that a virtual line formed by intersecting the surface including the first bonding surface and a surface including the second bonding surface become substantially parallel to a horizontal plane; a vacuum pad that has a sucking opening formed at the top, the vacuum pad being able to suck solder ball held in the ball holding holes into the sucking opening, and the vacuum pad being able to carry and release the solder ball at a position where both the first bonding surface and the second bonding surface can contact or be close to the solder ball; and an optical device to apply the solder ball with condensed beam by condensing inputted laser beam, the optical device having a laser output opening to output the condensed beam, the laser output opening of the optical device being able to access the solder ball close to or in contact with the solder ball, the solder ball contacting both the first bonding surface and the second bonding surface.

The slider holding means may have a plurality of connecting portions consisting of the first bonding surface and the second bonding surface, and the solder-ball holder has ball holding holes in the same number as the number of the connecting portions. The ventilating hole for exhausting gas from the ball holding hole, and injecting gas into the ball holding hole, may be formed on the bottom of the ball holding hole. The vacuum pad and the optical device may be integrally configured.

Furthermore, the optical device may be configured by disposing a condenser lens in the beam path of the laser beam, and forming a nitrogen gas injecting nozzle for injecting nitrogen gas to the side wall that forms a beam path space from the condenser lens to the laser output opening, so that the injected nitrogen gas is discharged out of the laser output opening.

In the method for solder-ball bonding according to another invention, in order to connect a first bonding surface and a second bonding surface by using solder ball, the first bonding surface being on pad formed on a slider held by a slider holding means of a disk device, the second bonding surface being on a pad formed on an end of a lead set on the slider holding means, and the second bonding surface is set substantially perpendicularly to and close to a surface including the first bonding surface, the method comprises the steps of holding the slider holding means so that the first bonding surface and the second bonding surface are at acute angles to vertical direction, respectively, and so that a virtual line formed by intersecting the surface including the first bonding surface and a surface including the second bonding surface become substantially parallel to a horizontal plane; placing a solder ball at a predetermined distance from the first bonding surface and the second surface by a solder-ball holder, the solder-ball holder having a stocker to stock plural holder balls and a ball holding hole to hold solder ball supplied from said stocker in predetermined positions, at a predetermined position; carrying solder ball held in the ball holding hole to a position where both the first bonding surface and the second bonding surface can contact or be close to the solder ball; and applying laser condensed beam to a solder ball, the solder ball contacting both the first bonding surface and the second bonding surface.

BRIEF DESCRIPTION OF THE DRAWINGS

FIG. 3 is an enlarged perspective view of the state where an optical device 4 is allowed to approach a stationary solder ball 135 contacting the pad bonding surface 116a of a bonding pad 116 and the bonding surface 110b of a lead pad 110a.

DETAILED DESCRIPTION OF THE PREFERRED EMBODIMENT

Figure 1:
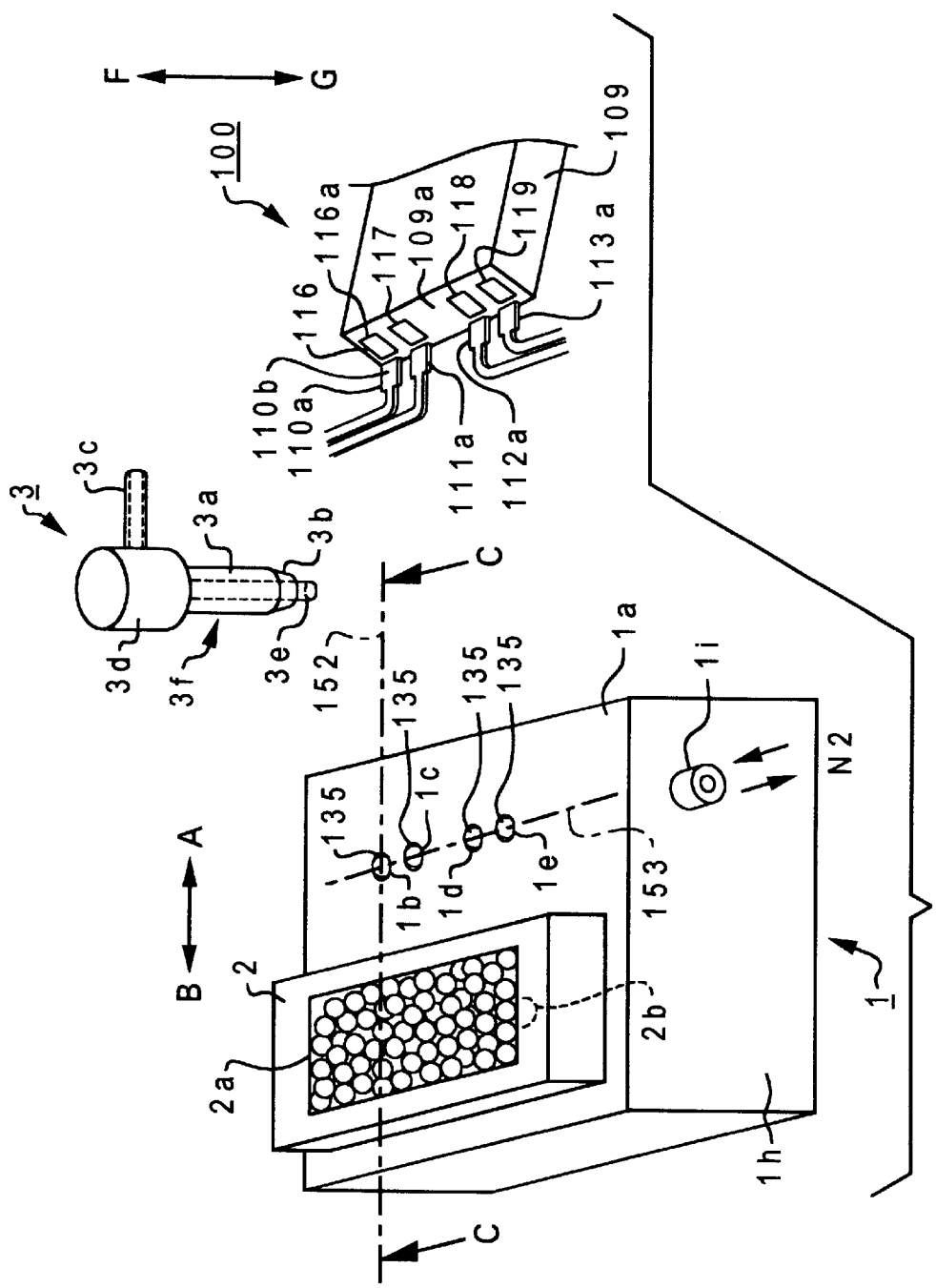
FIG. 1 is a perspective view of a solder-ball holder and a vacuum pad for sucking and carrying solder balls that configure the solder-ball bonding device according to Embodiment 1 of the present invention.
Figure 8:
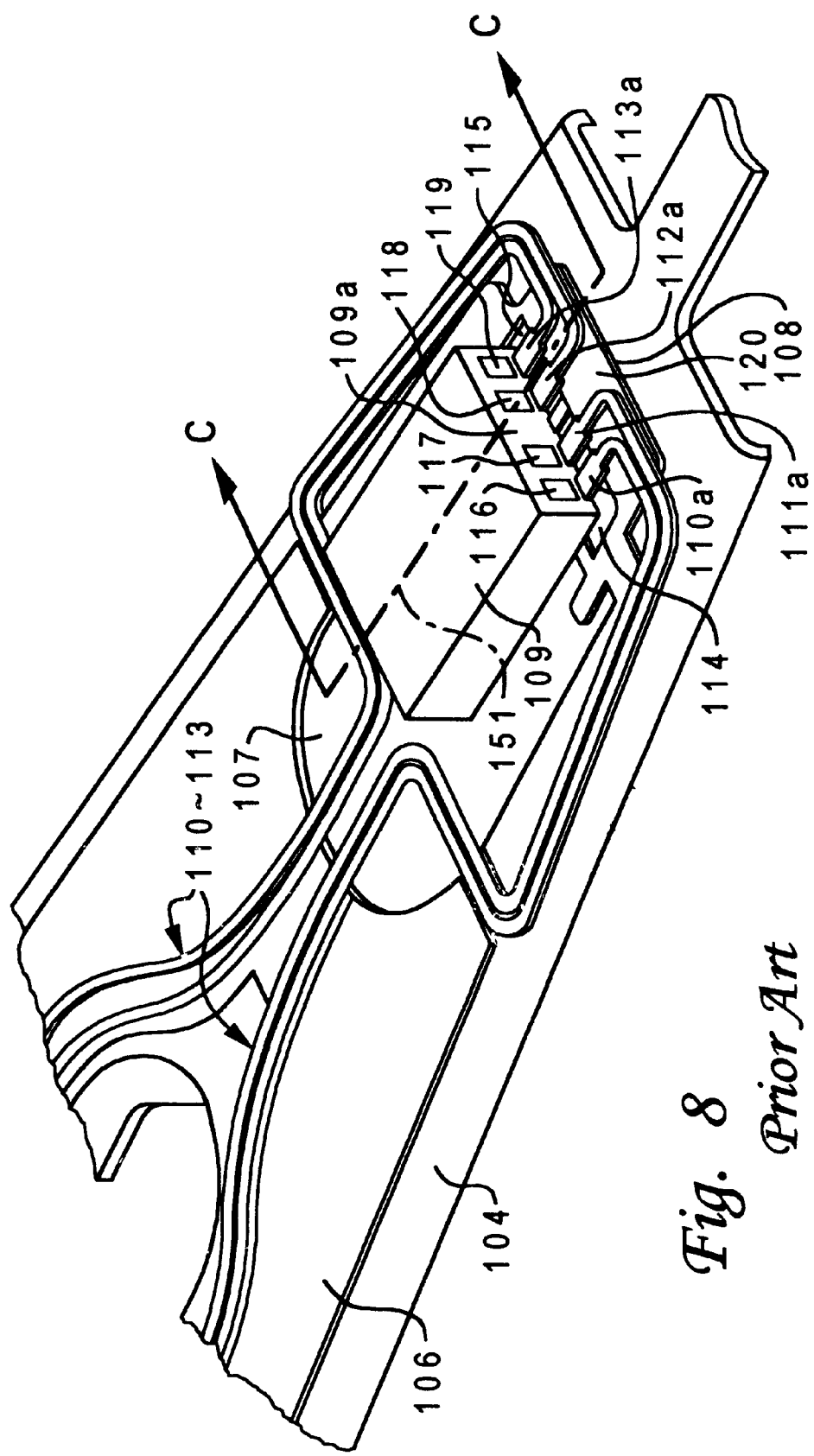
FIG. 8 is a partially enlarged view of the end portion of the HG assembly.
Figure 9:
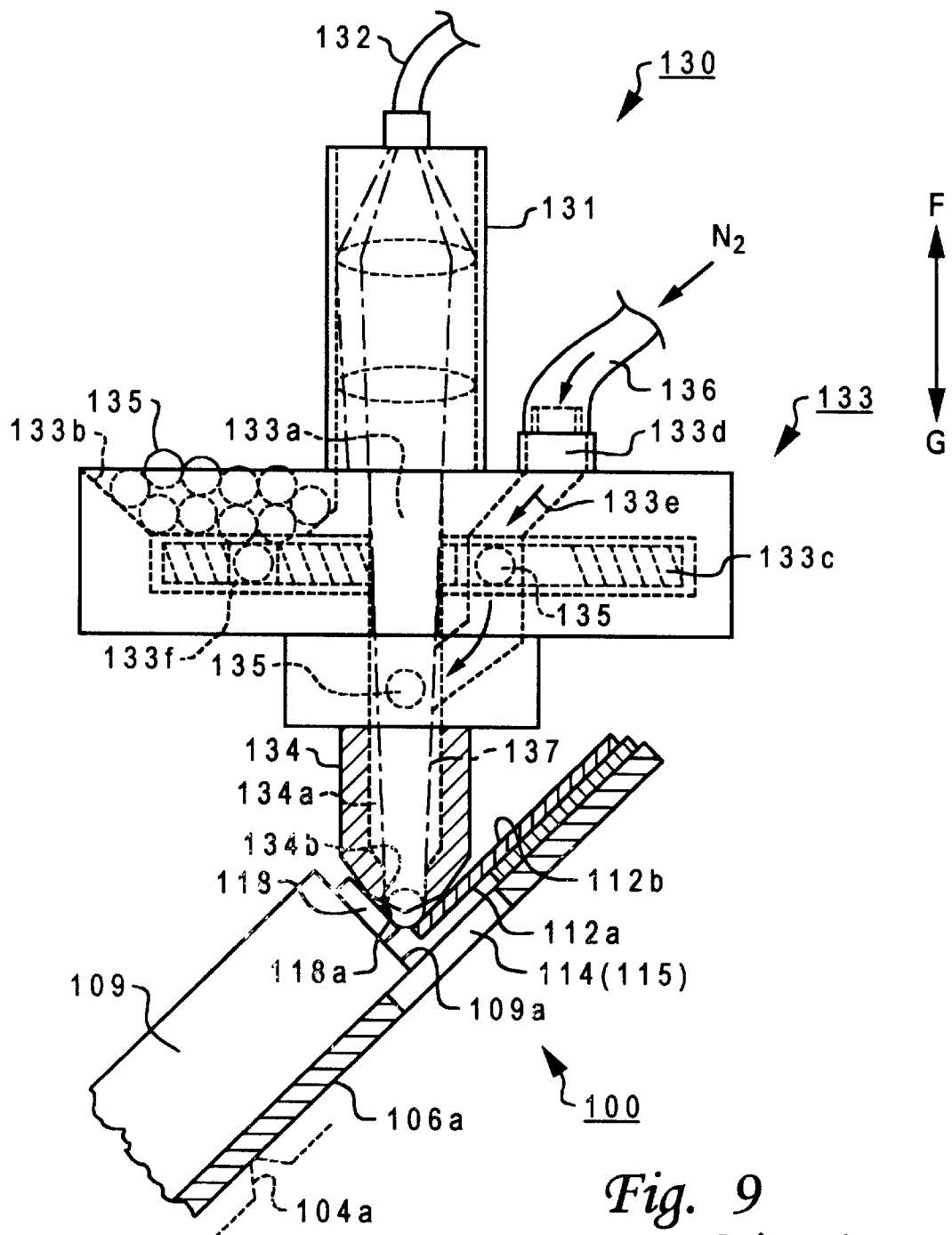
FIG. 9 is a schematic diagram of a conventional solder-ball bonding device.

Referring now to FIG. 1, a perspective view of a solder-ball holder and a vacuum pad for sucking and carrying solder balls that configure the solder-ball bonding device according to a first embodiment of the present invention is shown. In FIG. 1, four solder-ball holding holes 1b, 1c, 1d, and 1e each being able to accommodate a solder ball 135 are formed on the upper surface 1a of the solder-ball holder 1 linearly at a predetermined distance. This distance is substantially the same as the distance between bonding pads 116, 117, 118, and 119 formed on the front surface 109a of the above-described slider 109 shown in FIG. 8.

The hopper 2 is a box-shaped part movably held on the upper surface 1a of the solder-ball holder 1 movable in the directions of arrows A and B, and has a stocker 2a the upper portion of which is open to accommodate a large number of solder balls. On the bottom of the stocker 2a is formed a solder-ball discharging slot 2b located along the reference line 153 that connects the solder-ball holding holes 1b, 1c, 1d, and 1e when the hopper 2 stops at the discharging stop position to be described later that covers the four solder-ball holding holes 1b, 1c, 1d, and 1e.

Figure 2A:
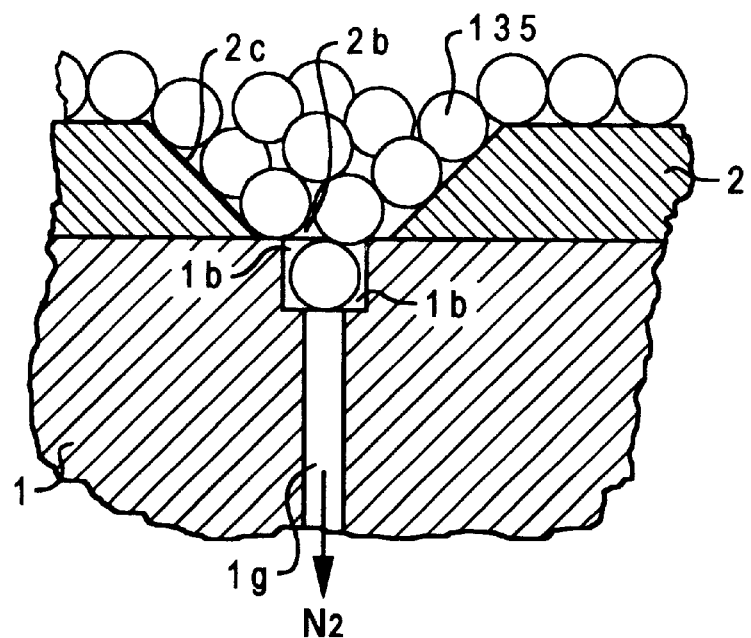
FIG. 2A is a partially sectional view of a hopper 2 and a solder-ball holder 1.

FIG. 2A shows a partially sectional view of the cross section that includes the line 152 passing through the center of the solder-ball holding hole 1b shown in the perspective view of FIG. 1, viewed from the arrow-C direction when the hopper 2 is moved to the above-described discharging stop position.

As FIG. 2A shows, on the bottom of the solder-ball holding hole 1b is formed a ventilating hole 1g spatially connected to the ventilating pipe 1i that is provided on the side 1h of the solder-ball holder 1 (FIG. 1). Ventilating holes are also formed on the bottoms of other solder-ball holding holes 1c, 1d, and 1e (FIG. 1), and are also connected spatially to the ventilating pipe 1i.

In the solder-ball holder 1 configured as described above, four solder-ball holding holes 1b, 1c, 1d, and 1e are disposed so as to correspond to bonding pads 116, 117, 118, and 119, respectively, in the vicinity of the above-described HG assembly 100 that is held by a support (not shown) so that the bonding surfaces of bonding pads 116, 117, 118, 119, and lead pads 110a, 111a, 112a, 113a become about 45 degrees to the F–G direction (vertical direction), which can utilize gravity, and so that the reference line 135 becomes substantially parallel to the front surface 109a of the slider 109.

Since solder-ball feeding operation conducted between the solder-ball discharging slot 2b and the four solder-ball holding holes 1b, 1c, 1d, and 1e is conducted in the same manner for each solder-ball holding hole, the operation will be described below exemplifying the operation between the solder-ball discharging slot 2b and the solder-ball holding hole 1b shown in FIG. 2.

As FIG. 2A shows, inside the solder-ball discharging slot 2b are formed slopes 2c so that surrounding solder balls 135 are easily concentrated in the solder-ball discharging slot 2b. When the hopper 2 is moved to the discharging stop position, a solder ball is fed in the solder-ball holding hole 1b. At this time, the ventilating pipe 1i is connected to the suction pump (not shown) and evacuated so that the solder-ball holding hole 1b sucks the surrounding solder balls to promote solder-ball feeding operation in addition to the gravitational fall of solder balls.

Thus, one solder ball is fed in each of the four solder-ball holding holes 1b, 1c, 1d, and 1e, thereafter, the hopper 2 is moved in the direction of the arrow B to the location not to interfere with following process operations. FIG. 1 shows the state at this time.

Next, the vacuum pad 3 held by a transporter (not shown) is allowed to approach the solder ball held in the solder-ball holding hole 1b, and the tip 3b is allowed to touch the solder ball 135. The vacuum pad 3 comprises, as FIG. 1 shows, an operating part 3f consisting of a hollow cylindrical part 3a and a conical part 3b that is connected to the cylindrical part 3a and has a sucking opening 3e at the tip, and a connecting part 3d that holds a discharging pipe 3c extended in the direction perpendicular to the operating part 3f and spatially connects the hollow portion of the cylindrical part 3a and the hollow portion of the discharging pipe 3c, and the sucking opening 3e is spatially connected to the hollow portion of the discharging pipe 3c. Furthermore, the discharging pipe 3c is connected to a suction pump (not shown) and evacuated in the timing described below.

Figure 2B:
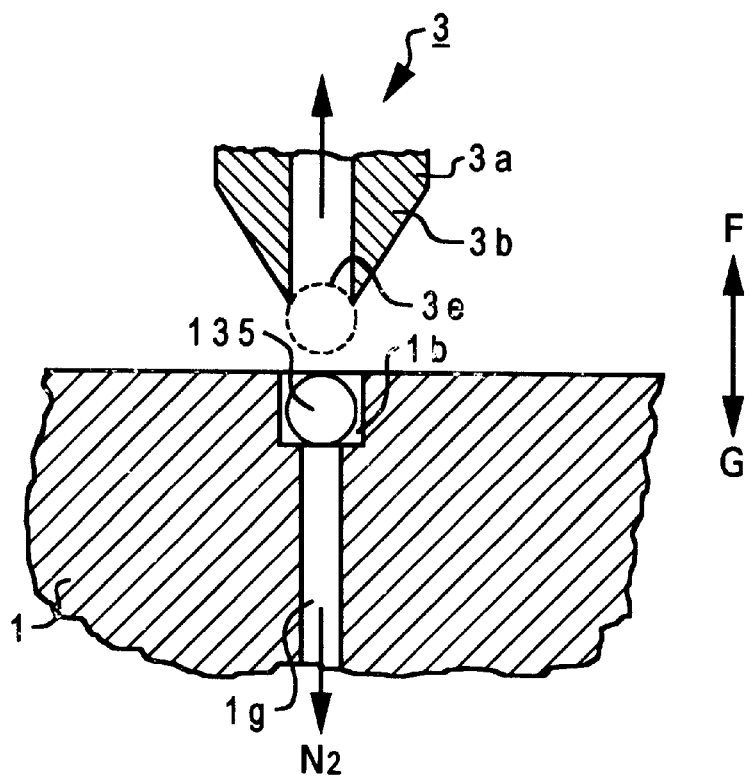
FIG. 2B shows a partially sectional view of a vacuum pad 3 and a solder-ball holder 1.

FIG. 2B shows the state where the vacuum pad 3 of the above-described configuration approaches the solder ball 135 held in the solder-ball holding hole 1b. Prior to, or on the approach of the vacuum pad 3, the ventilating pipe 1i of the solder-ball holder 1 (FIG. 1) is connected to a nitrogen gas cylinder (not shown) to introduce nitrogen gas $N_2$. The nitrogen gas $N_2$ flows out of the solder-ball holding hole 1b, and actuates the solder ball 135 upward (in the F direction). At this time, the vacuum pad 3 is also evacuated by the suction pump connected to the discharging pipe 3c, and attracts the solder ball approaching the sucking opening 3e on the tip.

Since the vacuum pad 3 is allowed to approach the solder ball 135 in the above-described state, the solder ball is quickly sucked into the sucking opening 3e as shown by the dotted line in FIG. 2B in the stage where the vacuum pad 3 approaches the solder ball 135. The nitrogen gas $N_2$ that flows out at this time inactivates the surface of the solder ball, and prevents the oxidation of the solder ball.

The vacuum pad 3 transports the solder ball 135 sucked by the vacuum pad 3 along the predetermined path, and releases the solder ball 135 at the location where the solder ball 135 contacts the pad bonding surface 116a of the bonding pad 116 and the bonding surface 110b of the lead pad 110a that configure the connecting portion of the HG assembly held under a tilted condition in the F–G direction (vertical direction).

At this time, since the pad bonding surface 116a of the bonding pad 116 and the bonding surface 110b of the lead pad 110a are maintained at about 45 degrees to the F–G direction (vertical direction) that can utilize gravity, and the virtual line where both bonding surfaces intersect is maintained to be parallel to a horizontal plane (plane that intersects perpendicularly to the vertical direction), the solder ball 135 stops in the state where it contacts both bonding surfaces at points.

Figure 3:
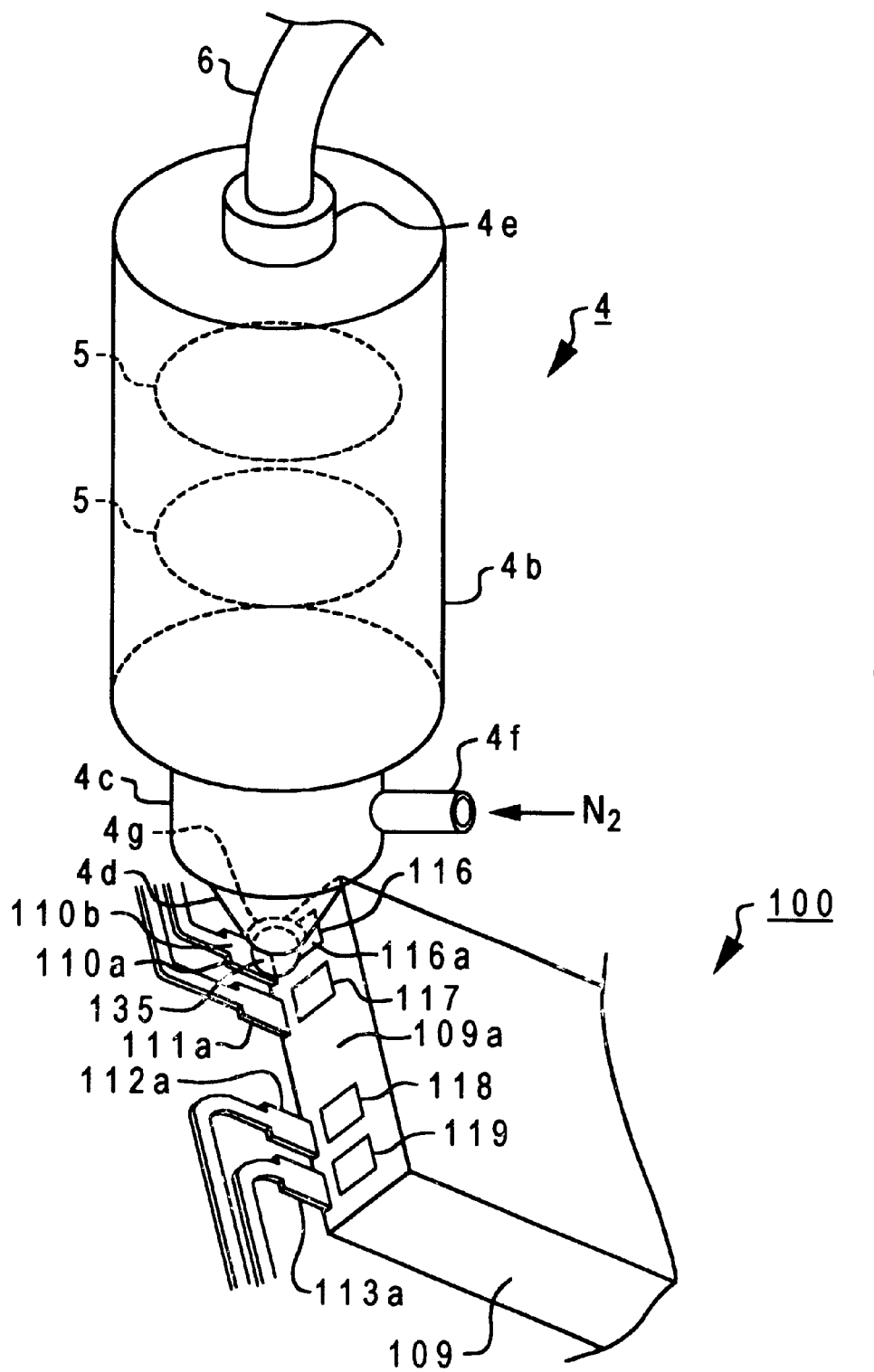
Figure 4:
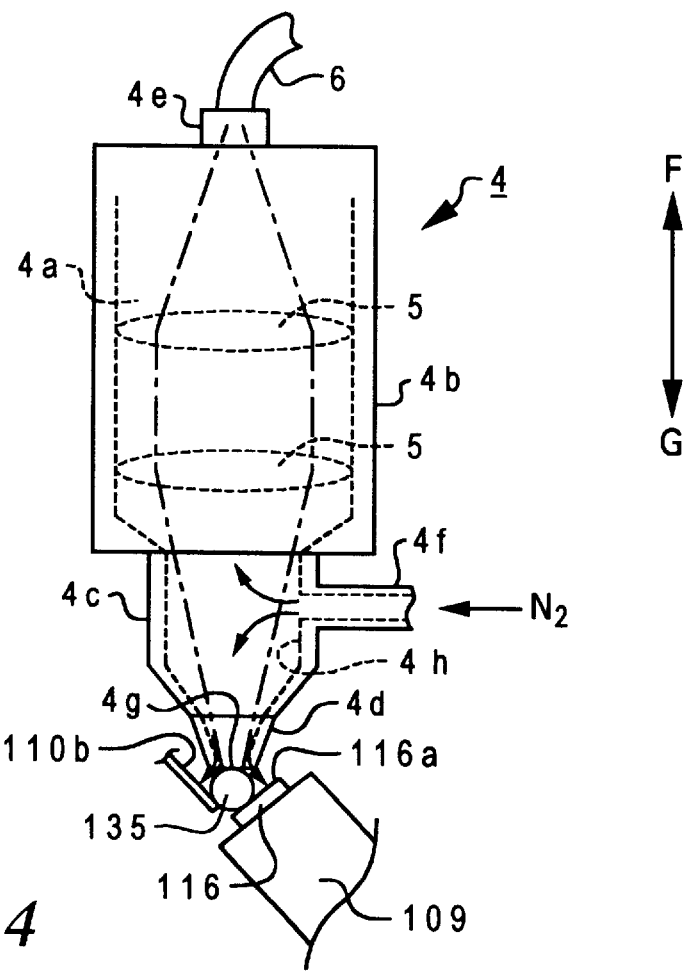
FIG. 4 is an enlarged diagram of an optical device 4 constituting a solder-ball bonding device according to Embodiment 1 of the present invention.

FIG. 3 shows an enlarged perspective view illustrating the state where an optical device 4 is allowed to approach a stationary solder ball 135 contacting the pad bonding surface 116a of a bonding pad 116 and the bonding surface 110b of a lead pad 110a, so as to reflow the solder ball as described below. FIG. 4 shows an enlarged diagram of an optical device 4 constituting a solder-ball bonding device according to Embodiment 1 of the present invention.

The optical device 4 forms a hollow laser-beam path space 4a internally, and comprises a lens holder 4b that holds a series of condenser lenses 5 disposed on the laser-beam path, a nitrogen injecting part 4c that injects nitrogen gas $N_2$ in the laser-beam path space, the tip 4d that approaches the solder ball and outputs condensed laser beams, and a laser-beam introducing part 4e that is connected to an optical fiber 6 and introduces laser beams into the laser-beam path space.

On the side wall 4h of the nitrogen gas injecting part 4c is formed a nitrogen gas injecting nozzle 4f connected to the nitrogen gas cylinder (not shown) for injecting nitrogen gas $N_2$ into the laser-beam path space in the timing described below, and at the tip 4d is formed a laser-beam outputting opening 4g for outputting converged laser beams to irradiate solder balls. The optical fiber 6 is optically connected to a laser oscillator (not shown), and leads laser beams outputted from the laser oscillator to the laser-beam introducing part 4e.

The laser-beam path space 4a of the optical device 4 formed as described above secures a sufficient space so as to minimize energy loss caused by reflection by the inner wall until the laser beams led by the optical fiber 6 are outputted as converged beams.

The optical device 4 configured as described above is moved by a transporter (not shown) to the radiating position shown in FIGS. 3 and 4, that is the position where the solder ball 135 that stops and contacts the pad bonding surface 116a of the bonding pad 116 and the bonding surface 110b of the lead pad 110a approaches such that a part of the solder ball 135 enters the laser-beam outputting opening 4g of the optical device 4.

Figure 5:
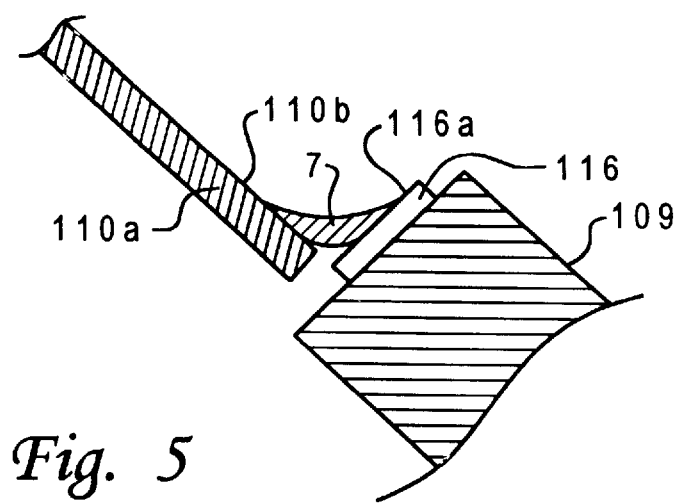
FIG. 5 is a diagram illustrating a solder-bonded portion.

Then, nitrogen gas $N_2$ is introduced, and the converged laser beams are radiated onto the solder ball 135 in the state where the nitrogen gas $N_2$ is blown to the solder ball 135 at a predetermined gas pressure to cause solder to reflow. The solder ball 135 is melted by the laser radiation as FIG. 5 shows, and the molten solder 7 wets the pad bonding surface 116a of the bonding pad 116 and the bonding surface 110b of the lead pad 110a to form the solder joint.

Also, the nitrogen gas $N_2$ that flows out at this time pushes the molten solder against each bonding surface, and covers the solder to prevent the oxidation thereof, as well as the adhesion of solder vapor or external suspended substances onto the lens.

It is preferable that the paths of three-dimensional movement of the vacuum pad 3 and the optical device 4 in implementing this solder bonding are previously set in each moving apparatus (not shown), and the vacuum pad 3 and the optical device 4 are moved along these paths.

When solder-bonding other three connecting portions formed by the pairs of bonding pads and lead pads, the vacuum pad 3 and the optical device 4 are moved along previously set paths, and the above-described process steps are repeated to form the similar solder joint in each connecting portion.

According to the solder-ball bonding device of Embodiment 1, as described above, since the optical device 4 is configured independently from the solder-ball holder 1, condenser lenses of large apertures can be adopted, the laser-beam path space can be secured to minimize the loss of laser beams on the laser-beam path, and the energy loss of the laser beams until solder balls are irradiated can be reduced.

Since the optical device 4 is independent from the solder-ball holder 1 for storing a large number of solder balls, the mass can be reduced, the optical device 4 itself becomes movable and its movement is easily controlled.

Also, by placing the solder-ball holder 1 in the vicinity of the held HG assembly, and by disposing four solder-ball holding holes 1b, 1c, 1d, and 1e so as to correspond to bonding pads 116, 117, 118, and 119 formed on the front surface 109a of the slider 109, respectively, the movement of the vacuum pad 3 can be reduced when it transports solder balls, and the time for movement can be minimized.

Furthermore, since a ventilating hole to the ventilating pipe 1i is formed on the bottom of each solder-ball holding hole, by repeating alternate evacuating and nitrogen-gas injecting through the ventilating pipe 1i, solder balls can be surely and smoothly fed into each solder-ball holding hole.

Embodiment 2

Figure 6:
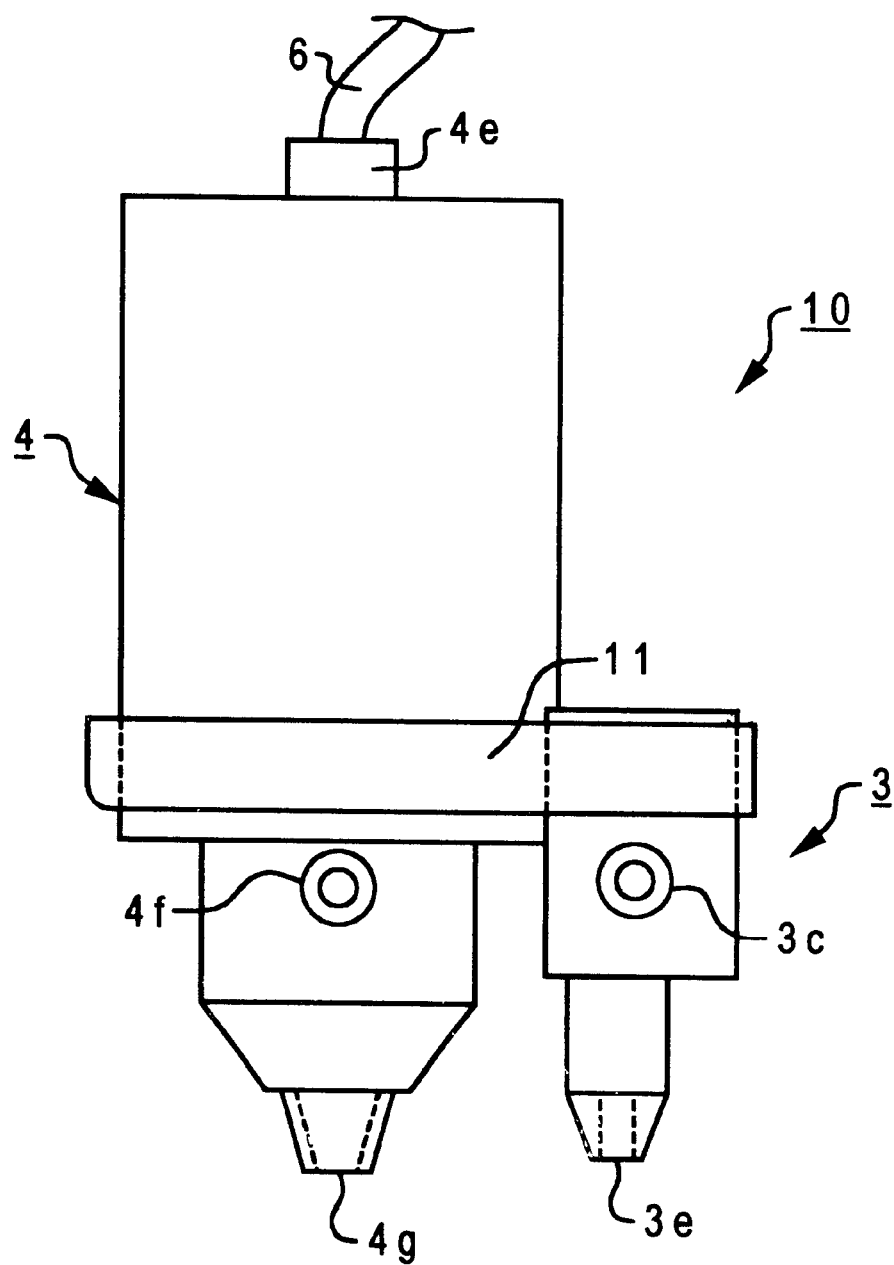
FIG. 6 is a schematic diagram of the mobile part of the solder-ball bonding device that has a vacuum pad and an optical device integrally configured according to Embodiment 2 of the present invention.
Figure 7:
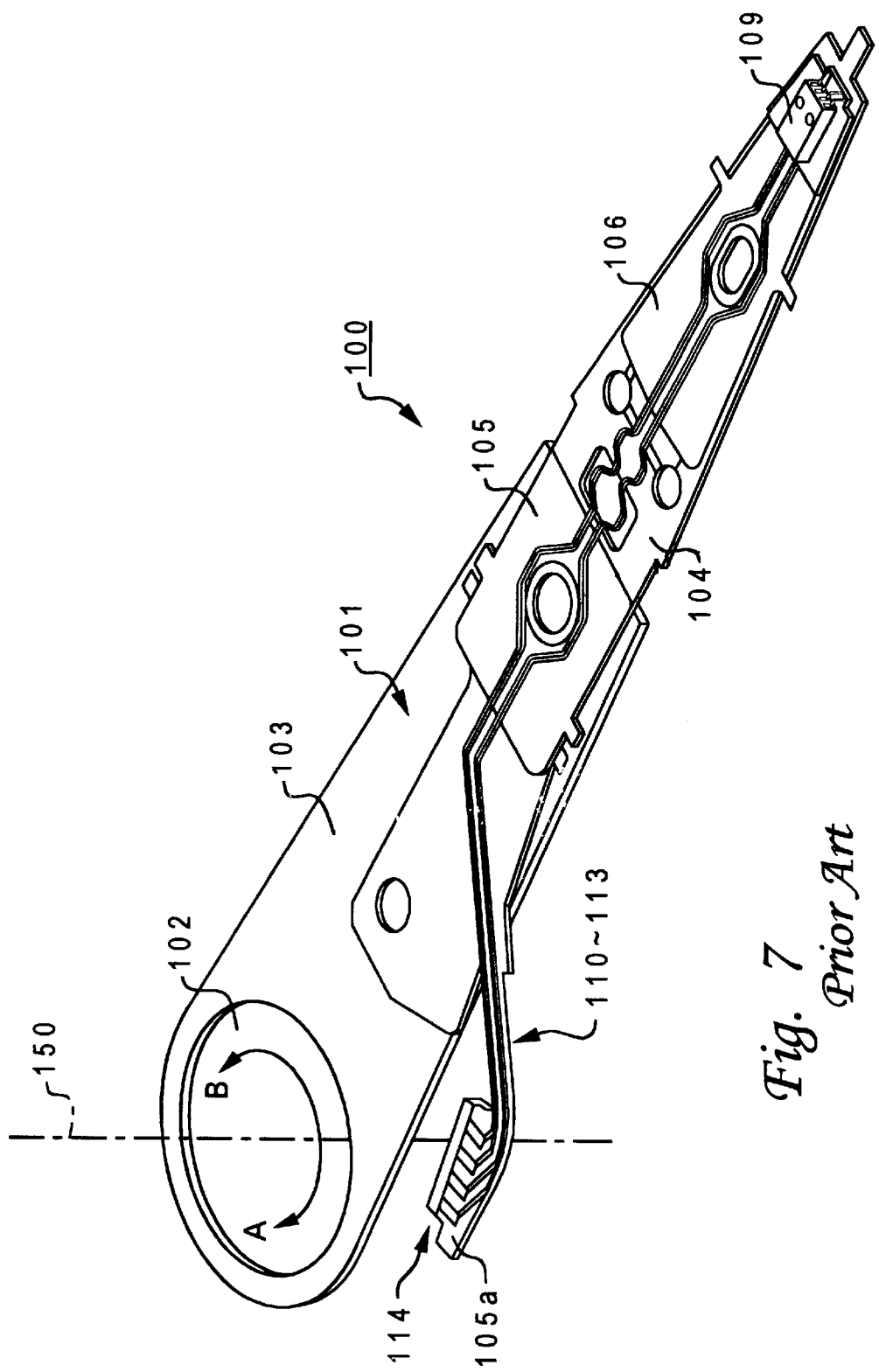
FIG. 7 is a perspective view of an HG assembly suitable for electrically connecting a lead and a slider using a solder-ball bonding method.

FIG. 6 shows a schematic diagram of the mobile part of the solder-ball bonding device that has a vacuum pad and an optical device integrally configured according to Embodiment 2 of the present invention.

Although the mobile part 10 in FIG. 6 is used in place of the vacuum pad 3 and the optical device 4 in Embodiment 1, the vacuum pad 3 and the optical device 4 that configure the mobile part 10 are of the same configuration as the vacuum pad and the optical device in Embodiment 1, and the same procedures can be used for the transportation and reflow of solder balls. Therefore, the description of the configuration and operation is omitted, and only different points from Embodiment 1 will be described.

The difference is that the vacuum pad 3 and the optical device 4 are collectively driven and moved by one transporter (not shown) while the transportation of solder balls by the vacuum pad 3 and the reflow of the solder balls by the optical device 4 are carried out.

According to the solder-ball bonding device of Embodiment 2, as described above, since the vacuum pad 3 and the optical device 4 are integrally configured as a mobile part 10, the vacuum pad 3 and the optical device 4 are collectively driven by a single transporter.

In the above-described embodiments, although it is described that the transportation of solder balls by the vacuum pad and the reflow of the solder balls by the optical device are alternately repeated when the four connecting portions are solder-ball bonded, the process is not limited to this, but four solder balls may be transported first, and then the reflow of the solder balls by the optical device may be continuously carried out four times.

Furthermore, in the above-described embodiments, although it is described that the pad bonding surface 116a of the bonding pad 116 and the bonding surface 110b of the lead pad 110a are tilted by about 45 degrees to the vertical direction, the process is not limited to this, but various aspects can be adopted so that the best solder joint is formed by reflowed solder.

The present invention has several advantages. Since condenser lenses of large apertures can be adopted in the optical device, and the laser-beam path space that can minimize the loss of laser beams on the laser-beam path can be secured, the energy loss of the laser beams until solder balls are irradiated can be reduced. Also, since the optical device is independently configured, the mass can be reduced, and the optical device is suitable for adopting the configuration where the optical device itself becomes movable and its movement is easily controlled. Furthermore, since the supply of solder balls, locating, and reflow can be carried out by independent devices, the operation procedures can be combined freely for the improvement of efficiency.

In addition, since solder balls can be provided correspondingly in the vicinity of a plurality of connecting portions for solder bonding, the distance of the transportation of solder balls can be reduced, and the time for transporting solder balls can be shortened. The feeding of solder balls from the stocker of the solder-ball holding hole, and the transfer of solder balls to the vacuum pad can be carried out surely and smoothly. Also, since the vacuum pad and the optical device are integrally configured, the vacuum pad and the optical device can be driven and moved by one transporter. Moreover, the oxidation of solder can be prevented by means of a nitrogen gas, and the adherence of the vapor of molten solder or external suspended substances onto condenser lenses can be prevented.

What is claimed is:

1. A solder-ball bonding device for connecting a first bonding surface to a second bonding surface, the first bonding surface being on a pad formed on a slider held by a slider holder of a disk device, the second bonding surface being on a pad formed on an end of a lead set on the slider holder, and the second bonding surface being set substantially perpendicular to a surface including the first bonding surface, comprising:

a solder-ball holder having a stocker for stocking a plurality of solder balls and ball holding holes to hold solder balls supplied from the stocker in predetermined positions, the solder ball holder being set in a position at a predetermined distance from the slider holder so that the first bonding surface and the second bonding surface are at acute angles to a vertical direction, respectively, and so that a virtual line formed by intersecting the surface including the first bonding surface and a surface including the second bonding surface becomes substantially parallel to a horizontal plane;

a vacuum pad having a sucking opening formed at a top, the vacuum pad being able to suck a solder ball held in the ball holding holes into the sucking opening, and the vacuum pad being able to carry and release the solder ball at a position where both the first bonding surface and the second bonding surface can contact or be close to the solder ball; and an optical device to apply the solder ball with a condensed beam by a condensing inputted laser beam, the optical device having a laser output opening to output the condensed beam, the laser output opening of the optical device being able to access the solder ball close to or in contact with the solder ball, the solder ball contacting both the first bonding surface and the second bonding surface.

2. The solder-ball bonding device of claim 1 wherein the slider holder has a plurality of connecting portions including the first bonding surface and the second bonding surface, and the solder-ball holder has ball holding holes that are equal in number to the connecting portions.

3. The solder-ball bonding device of claim 2 wherein a ventilating hole for exhausting gas from the ball holding hole, and injecting gas into the ball holding hole, is formed on a bottom of the ball holding hole.

4. The solder-ball bonding device of claim 1 wherein the vacuum pad and the optical device are integrally configured.

5. The solder-ball bonding device of claim 1 wherein the optical device is configured by disposing a condenser lens in a beam path of the laser beam, and forming a nitrogen gas injecting nozzle for injecting nitrogen gas to a side wall that forms a beam path space from the condenser lens to the laser output opening, so that the injected nitrogen gas is discharged out of the laser output opening.

6. A method of connecting a first bonding surface and a second bonding surface by using solder ball, the first bonding surface being on pad formed on a slider held by a slider holder of a disk device, the second bonding surface being on a pad formed on an end of a lead set on the slider holder, and the second bonding surface is set substantially perpendicular to a surface including the first bonding surface, comprising the steps of:

holding the slider holder such that the first bonding surface and the second bonding surface are at acute angles to a vertical direction, respectively, and so that a virtual line formed by intersecting the surface including the first bonding surface and a surface including the second bonding surface becomes substantially parallel to a horizontal plane;

placing a solder ball at a predetermined distance from the first bonding surface and the second bonding surface by a solder-ball holder, the solder-ball holder having a stocker for stocking a plurality of holder balls and a ball holding hole to hold solder ball supplied from the stocker in predetermined positions at a predetermined position;

carrying solder ball held in the ball holding hole to a position where both the first bonding surface and the second bonding surface can be adjacent to the solder ball; and applying a laser condensed beam to the solder ball, the solder ball contacting both the first bonding surface and the second bonding surface.

* * * * *